(12) United States Patent
Chung

(10) Patent No.: US 6,790,743 B1
(45) Date of Patent: Sep. 14, 2004

(54) [METHOD TO RELAX ALIGNMENT ACCURACY REQUIREMENT IN FABRICATION FOR INTEGRATED CIRCUIT]

(75) Inventor: Henry Chung, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 39 days.

(21) Appl. No.: 10/604,653

(22) Filed: Aug. 7, 2003

(51) Int. Cl.⁷ .............................................. H01L 21/76

(52) U.S. Cl. ........................ 438/401; 438/942; 438/950

(58) Field of Search ........................... 438/401, 942–950

(56) References Cited

U.S. PATENT DOCUMENTS 6,514,780 B2 * 2/2003 Manyoki ...................... 438/18

* cited by examiner

Primary Examiner—H. Jey Tsai
(74) Attorney, Agent, or Firm—Jiang Chyun IP Office

(57) ABSTRACT

A method to relax the alignment accuracy requirement in an integrate circuit manufacturing is described. The method comprises forming a mask layer over a substrate, and the mask layer comprises a plurality of first openings. Thereafter, a buffer layer fills the first opening, followed by forming a photoresist layer over the substrate. The photoresist layer is then patterned to form a second opening that corresponds to the first opening, and the second opening exposes a portion of the buffer layer. Isotropic etching is then performed to remove the buffer layer exposed by the second opening to expose a sidewall of the first opening that corresponds to the second opening. The photoresist layer is further removed to expose the mask layer that comprises the embedded buffer layer and the opening pattern, which is used as a hard mask layer in a subsequent process.

19 Claims, 6 Drawing Sheets

[METHOD TO RELAX ALIGNMENT ACCURACY REQUIREMENT IN FABRICATION FOR INTEGRATED CIRCUIT]

BACKGROUND OF INVENTION

1. Field of Invention

The present invention relates to a fabrication method for an integrated circuit. More particularly, the present invention relates to a method for lowering the demand in alignment accuracy in an integrated circuit fabrication process.

2. Description of Related Art

Photolithography is one of the most important steps in semiconductor processing. As devices become smaller, the demand in alignment accuracy is higher and the processing window is reduced. In order to have an accurate alignment, a more advanced and usually more costly lithography machine is required.

For example, the fabrication of a conventional mask ROM (Read-Only Memory) device would encounter the aforementioned problem. During the coding of a mask ROM device according to the prior art, as shown in FIG. 1, a pre-coding layer 20 is first formed on a substrate 10. This pre-coding layer 20 comprises a plurality of openings 30 that corresponds to the pre-coding region of the substrate 10. A photoresist layer 40 that comprises the pre-coding opening 50 is formed over the pre-coding layer 20. Using the photoresist layer 40 as a coding mask, an ion coding process is performed. Since forming the opening 50 in the photoresist layer 40, the opening 50 has to align accurately to the pre-coding region in the substrate 100. In the case when a misalignment occurs, as shown in FIG. 1, the opening is excessively misaligned to one side. The pre-coding opening 30 is then not completely exposed. Therefore, during the coding process, only a portion of the dopants are implanted into the coding region and the purpose of coding is thereby not achieved. In the prior art, the alignment accuracy requirement is very high. The processing window is therefore very small. In order to increase the alignment accuracy, a more advanced machine is used for the lithographic process. However, an advanced machine would greatly increase manufacturing cost.

Referring to FIG. 2, in order to obviate the aforementioned problem, one conventional approach is to enlarge the opening 60 of the coding mask 40 in order to completely expose the pre-coding opening 30 in the mask layer 20. However, even the dimension of the opening 60 of the coding mask 40 is increased, extra dopants may be implanted into the undesired coding region. The distance between the neighboring pre-coding openings 30 needs to be increased to prevent such problem. Consequently, the miniaturization of the device can not be effectively achieved.

SUMMARY OF INVENTION

Accordingly, the present invention provides a method for forming a mask layer, wherein the alignment accuracy requirement in the fabrication of an integrated circuit can be relaxed so as to greatly increase the process window.

The present invention provides a method to relax alignment accuracy requirement in the fabrication of an integrated circuit, wherein the method comprises forming a mask layer over a substrate, and the mask layer is formed with a plurality of first openings. Thereafter, a buffer layer fills the first openings. A photoresist layer is then formed on the substrate, followed by patterning the photoresist layer to form a second opening which exposes a part of the buffer layer. Isotropic etching is further performed to remove the buffer layer exposed by the second opening to expose the sidewall of the corresponding first opening. The photoresist layer is further removed to expose the mask layer that comprises the opening pattern and the embedded buffer layer, wherein the mask layer is served as a hard mask for the subsequent process.

In accordance to the embodiment of the present invention, the mask layer is formed with, for example, silicon oxide, while the buffer layer is formed with, for example, a spin-on material or a metal. To remove the buffer layer exposed by the second opening, an etchant of a high buffer layer-to-mask layer etch selectivity is used. Therefore, even an alignment error occurs when the photoresist layer is defined to form the second opening, the buffer layer in the first opening that corresponds to the second opening is completely removed as long as the second opening exposes a portion of the buffer layer in the corresponding first opening. In other words, as long as the process in defining the first opening in the mask layer is accurate, the alignment accuracy requirement for the second opening can be signficiantly relaxed. When the second opening is formed to expose a portion of the buffer in the corresponding first opening, the first opening is exposed when the buffer layer in the first opening that corresponds to the second opening is completely removed. The mask layer that comprises the opening and the embedded buffer layer can thus serve as a hard mask of the subsequent process.

In accordance to the present invention, the opening in the mask layer is first filled with a buffer layer. Further using a photoresist layer as an etching mask, the buffer layer in a pre-determined region is completely removed based on the different etching rate of the buffer layer and the mask layer. The mask layer that comprises the opening and the embedded buffer layer is then used as a hard mask layer for the subsequent processing.

Since the alignment accuracy requirement for the second opening is relaxed, the process window can be greatly increased according to the present invention.

Since the opening of the mask layer can be accurately aligned with the predetermined region, the consequences resulted from a misalignment of the opening in the mask layer as in the prior art are prevented.

Moreover, the mask layer that comprises the opening, and the embedded buffer layer are together used as a hard mask in the subsequent manufacturing process. The alignment accuracy of the hard mask layer is completely determined by the accuracy in the patterning process of the mask layer and will not be affected by any alignment error occurs during the patterning of the photoresist layer for the second opening.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
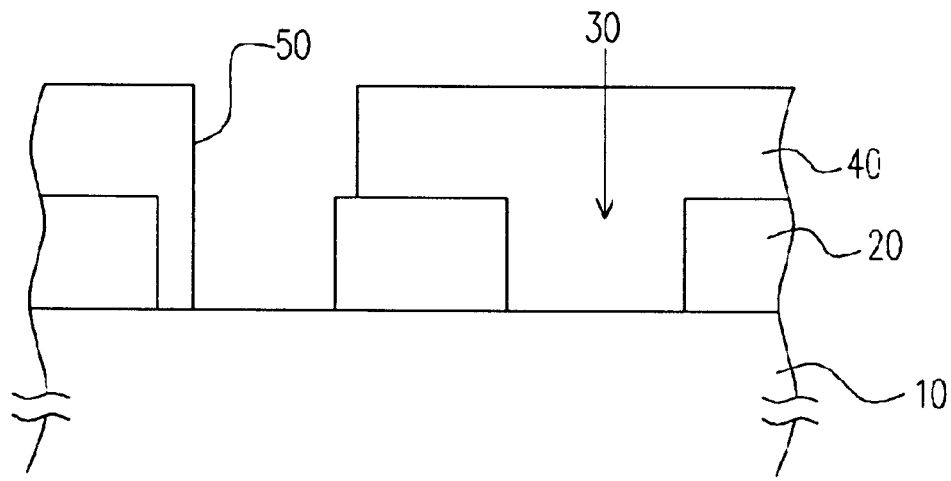
FIGS. 1 and 2 are schematic drawings illustrating the fabrication method for a mask ROM device according to the prior art.
Figure 2:
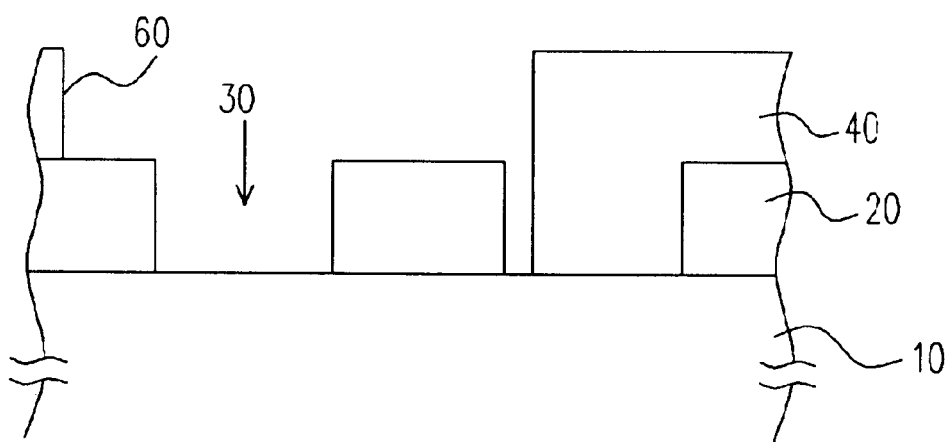
Figure 3A:
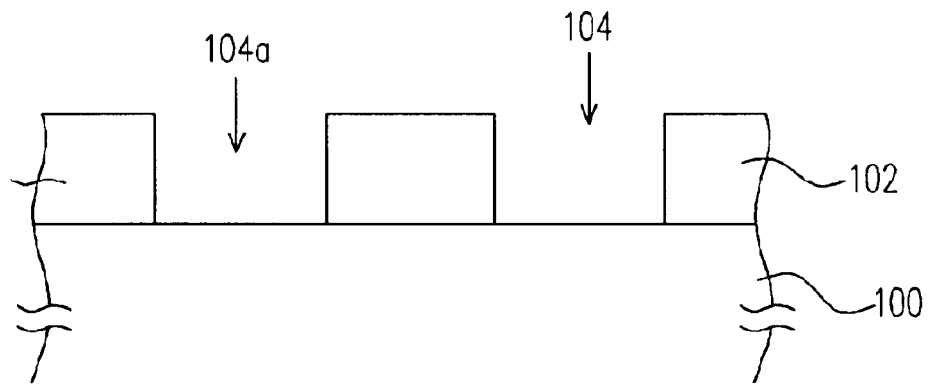
FIGS. 3A to 3E are schematic, cross-sectional view diagrams illustrating process flow for fabricating a hard mask layer according to a first aspect of the present invention.

First Aspect of the Present Invention: Referring to FIG. 3A, a substrate 100 is provided, wherein a patterned mask layer 102 is formed over the substrate 100. The mask layer 102 comprises a plurality of openings 104 that exposes the substrate 100. The mask layer 102 is formed with a material that comprises, for example, silicon oxide, and the mask layer 102 is formed by, for example, chemical vapor depositing a silicon oxide layer, followed by using photolithography and etching techniques to pattern the silicon oxide layer to form the openings 104. The reference number 104a depicts one opening in the plurality of the openings 104. The sizes and shapes of the various openings 104 can be the same or different, or the various openings 104 can have the same shapes but different sizes. The plurality of the openings 104 can be arranged in an array or randomly.

Figure 3B:
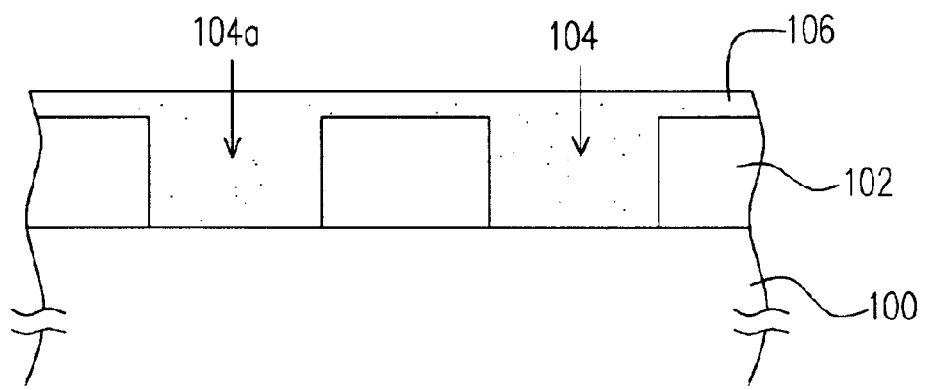

Thereafter, as shown in FIG. 3B, a buffer layer 106 is formed over the substrate 100. The buffer layer 106 covers the top surface of the mask layer 102 and fills the openings 104. The buffer layer 106 etches significantly faster than the mask layer 102. The buffer layer 106 is formed with, for example, spin-on glass. The buffer layer 106 can also formed with, for example, a metal, such as, tungsten, titanium or titanium nitride.

Figure 3C:
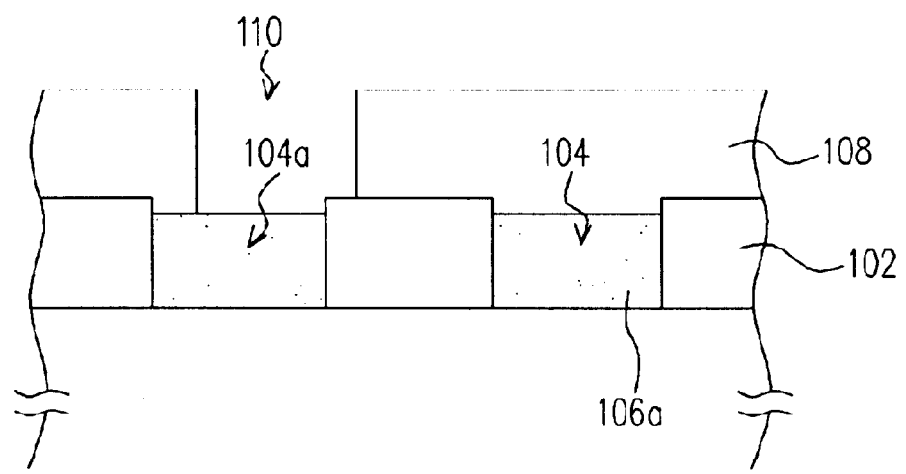

Thereafter, as shown in FIG. 3C, the buffer layer 106 that is above the surface of the mask layer 102 is removed, leaving the buffer layer 106a inside the opening 104, wherein the buffer layer inside the opening 104a is depicted with the reference number 106b. Removing the buffer layer 106 above the surface of the mask layer 102 includes performing, for example, an etch back process or a chemical mechanical polishing process. A mask layer 108, for example, a photoresist layer, is then formed over the substrate 100. This mask layer 108 comprises at least an opening 110, wherein the number of opening 110 is greater than one, but not greater than the number of the opening 104. Further, the position of the opening 110 correspond to the pre-determined position of the opening 104a in the opening 104, wherein the opening 110 exposes a portion of the buffer layer 106b that fills the opening 104a.

Figure 3D:
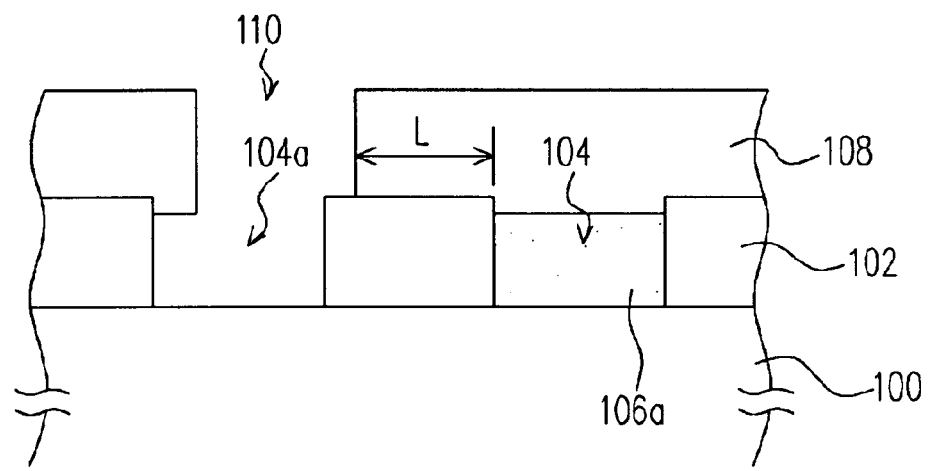

Thereafter, as shown in FIG. 3D, due to the significantly higher etch rate of the buffer layer 106b and choosing an etchant that can provide a high etching selectivity ratio between the buffer layer 106a and the mask layer 102, and between the buffer layer 106a and the mask layer 108, the buffer layer 106b inside the opening 104a that is exposed by the opening 110 is completely removed to expose the bottom and the sidewall of the opening 104a while keeping the size and the shape of the opening 104a intact. In other words, using an etchant that has a high etching selectivity ratio to remove the buffer layer 106a, the size and shape of the opening 104a in the mask layer 102 can maintain perfectly intact. Removing the buffer layer 106b in the opening 104a includes performing, for example, isoptropic etching, such as, wet etching. When the buffer layer 106b is, for example, spin-on glass, a hydrofluroic acid solution, which provides a higher etching rate to the buffer layer 106b but a lower etching rate to the mask layer 102, 108, can be used as an etchant.

Figure 5:
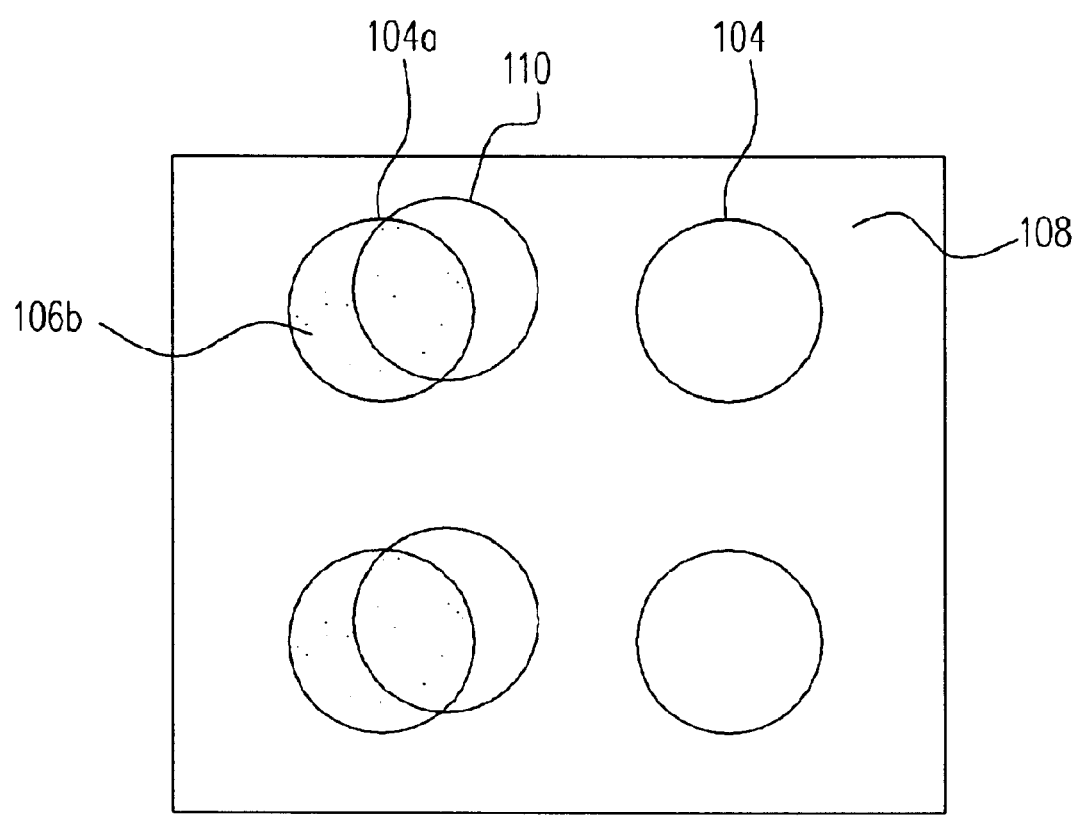
FIG. 5 is a schematic top view of FIGS. 3C and 4C of the present invention.

One point that is worth noting is that the opening 110 in the mask layer 108 needs not be fully exposed the buffer layer 106b in the opening 104a for the complete removal of the buffer layer 106b. Therefore, the dimension of the opening 110 can be reduced to increase the distance "L" between the perimeter of the opening 110 and the perimeter of the neighboring openings 104 so as to increase the process latitude. Further, the opening 110 is not limited to a circular shape. Therefore, the patterning conditions are less demanding and, thus, a less expensive machine can be used to perform this process. Further, even the opening 110 in the mask layer 108 is not perfectly aligned to the opening 104a in the mask layer 102, as shown in FIGS. 3C and 5, the buffer layer 106b in the opening 104a is completely removed in the subsequent etching, as long as the opening 110 in the mask layer 108 exposes a portion of the buffer layer 106b in the opening 104a. Further, the size and shape of the opening 104a are perfectly maintained without any alteration.

Figure 3E:
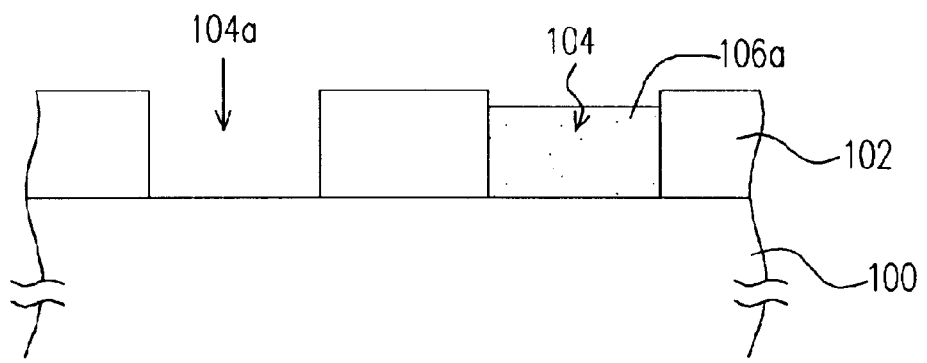

Thereafter, as shown in FIG. 3E, the mask layer 108 is removed to expose the mask layer 102. The opening 104 in the mask layer 102 is filled with the buffer layer 106a, while the opening 104a is not filled with any buffer layer and exposes the substrate 200.

The above mask layer 102 that comprises the embedded buffer layer 106a, and the opening 104a can together use as a hard mask in a subsequent process, for example, as a hard mask for performing an ion implantation process or an etching process.

In other words, the opening 104 in the mask layer 102 is first filled with the buffer layer 106a, followed by using the photoresist layer 108 as an etching mask and an etchant that has a high etching rate ratio between the buffer layer 106a and the mask layer 108, 102 to completely remove the buffer layer in a pre-determined region. Further, the size and shape of the opening 104a are kept intact. Thereafter, the mask layer that comprises the opening 104a, and the embedded buffer layer 106a can together be used directly as a hard mask for the subsequent process.

The opening 104a in the mask layer 102 can be accurately aligned to the pre-determined region. The problems resulted from a misalignment of the opening in the mask layer are prevented.

When the mask layer 102 is defined to form the opening 104, the density of the opening 104 pattern is uniform. The openings in the hard mask layer can have the same dimensions if the openings 104 have the same dimension.

Further, since the mask layer 102 that comprises the opening 104a, and the embedded buffer layer 106a are together used as a hard mask for the subsequent process, the alignment accuracy of the hard mask layer is completely determined by the accuracy in the patterning of the mask layer 102. Therefore, any error that occurs during the patterning of the photoresist layer 108 will not affect the accuracy of the hard mask layer.

Since the opening 110 in the photoresist layer 108 only needs to expose a part of the buffer layer 106a in the opening 104a of the mask layer 102, the dimension of the opening 110 can be reduced and does not need to be as big as required in prior art. Since the dimension of the opening 110 can be the same as or smaller than that of the opening 104, the distance between the openings 104 in the mask layer 102 can be effectively reduced to achieve the miniaturization of devices.

Second Aspect of the Present Invention: Further, forming a mask layer 102 with an embedded buffer layer 106a is not limited to the method disclosed in the first aspect of the present invention. Forming a mask layer 102 with an embedded buffer layer 106a can also use the method disclosed in the second aspect of the present invention. The second aspect of the present invention is detailed in the following in accordance to FIGS. 4A to 4E.

Figure 4A:
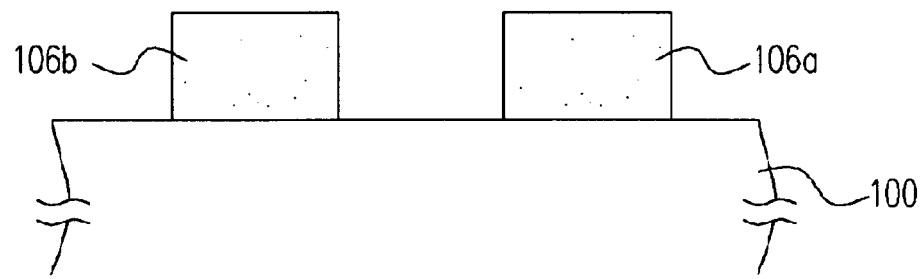
FIGS. 4A to 4E are schematic, cross-sectional view diagrams illustrating process flow for fabricating a hard mask layer according to a second aspect of the present invention.

Referring to FIG. 4A, a substrate 100 is provided, wherein a plurality of buffer layers 106a is formed over the substrate 100. The reference number 106b is used to depict one of the buffer layers 106a. The sizes and the shapes of the various buffer layers 106a can be the same or different, or the buffer layers 106a can have the same shape but different sizes. Further, the plurality of the buffer layers 106a can be arranged in an array or randomly. The buffer layer 106a comprises a material that includes a spin-on material, such as, spin-on glass, or a metal, such as, tungsten, titanium or titanium nitride. Forming the buffer layer 106a includes forming a blanket buffer layer over the substrate 100, followed by using photolithography and etching techniques to pattern the blanket buffer layer.

Figure 4B:
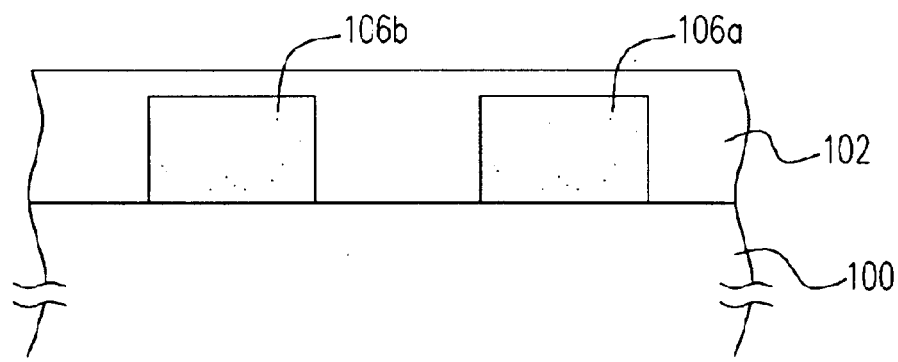

Thereafter, as shown in FIG. 4B, a mask layer 102 is formed over the substrate 100 to cover the top surface and the surrounding of the buffer layer 106a. The materials used in forming the mask layer 102 and the buffer layer 106a have different etching selectivity. The material used for the mask layer 102 include, for example, silicon oxide, and is formed by, for example, chemical vapor deposition or high-density plasma chemical vapor deposition.

Figure 4C:
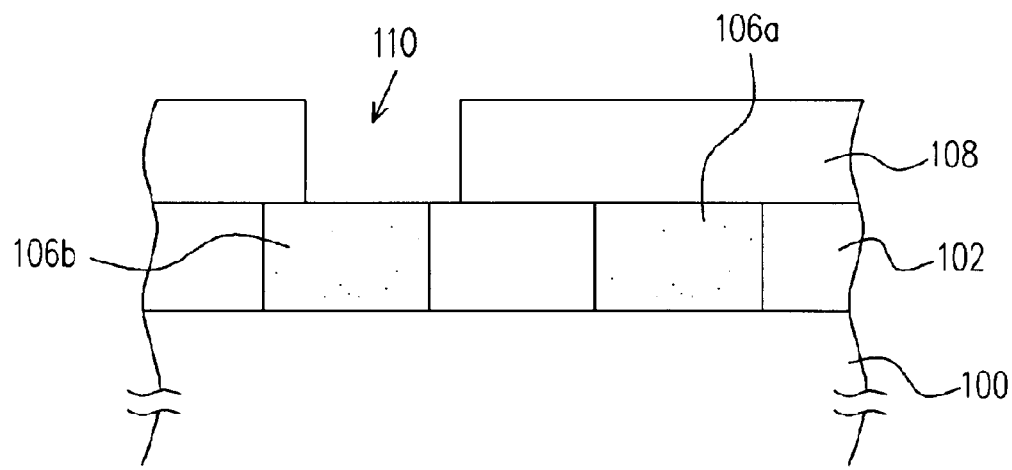

Continuing to FIG. 4C, the mask layer 102 that covers the top surface of the buffer layer 106a is removed, leaving the mask layer 102a that fills the surrounding of the buffer layer 106a. Removing the mask layer 102 includes performing etch back or chemical mechanical polishing. Subsequent to the removal of the mask layer 102 that covers the top surface of the buffer layer 106a, a mask layer 102a with an embedded buffer layer 106a is thereby formed over the substrate 100. Another patterned mask layer 108 is then formed over the substrate 100, for example, a photoresist layer. This mask layer 108 comprises an opening 110, which exposes a part of the buffer layer 106b.

Figure 4D:
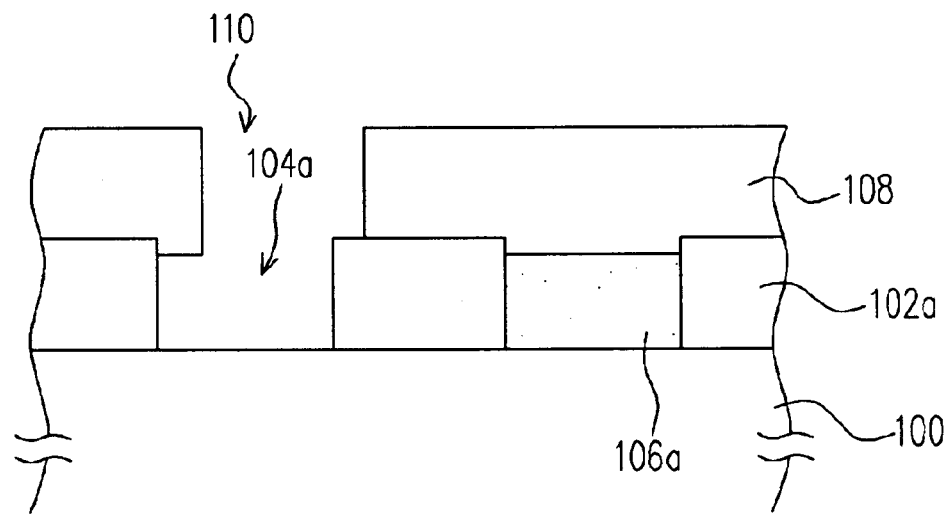

Referring to FIG. 4D, due to the high etching selectivity between the buffer layer 106b and the mask layer 102a, and between the buffer layer 106b and the mask layer 108, the buffer layer 106b is completely removed to form an opening 104a in the mask layer 102 without any adverse effect induced upon the mask layer 102 and the mask layer 108. Removing the buffer layer 106b includes performing isotropic etching, such as, wet etching. The buffer layer 106b can form with a spin-on glass material, and removing the buffer layer 106b is accomplished by using a hydrofluoric acid solution, an etchant that has a higher etching rate to the buffer layer 106 but a lower etching rate to the mask layer 102, 108.

Figure 4E:
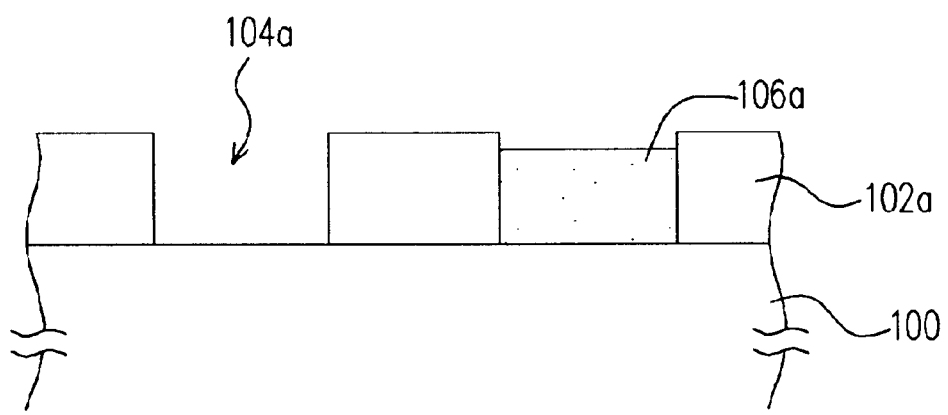

Referring to FIG. 4E, the mask layer 108 is removed to expose the mask layer 102. The mask layer 102 that comprises the embedded buffer layer 106a, and the opening 104a can together be used as a hard mask for a subsequent process, for example, for an ion implantation process or an etching process.

The aforementioned method includes forming the buffer layer 106a above the substrate 100, followed by forming a mask layer 102a at the surrounding of the buffer layer 106a. Thereafter, a mask layer 102 with an opening 104a and an embedded buffer layer 106a are together formed as in the first aspect of the present invention and therefore will not be reiterated.

In accordance to the present invention, an embedded layer is formed on the substrate, further by forming an opening in the embedded layer as a hard mask layer for a subsequent process. The embedded layer is formed by embedding a first material layer and a second material layer, wherein the first material layer (buffer layer 106a) is not in a continuous phase, and is encompassed by the second material layer (mask layer 102) to form a continuous phase. In the first aspect of the present invention, a continuous phase is first formed, followed by forming a discontinuous phase, while in the second aspect of the present invention, a discontinuous phase is first formed, followed by forming a continuous phase.

The methods disclosed in the above two aspects of the present invention are applicable in the fabrication of a mask ROM device. The substrate 100 includes a semiconductor substrate having a gate and source/drain regions already formed thereon and therein, respectively. The mask layer 102 is, for example, a pre-coding layer, and the opening 104 in the mask layer 102 is, for example, the pre-coding opening formed in the pre-coding layer. The opening 110 in the mask layer 108 is, for example, a coding opening defined by a coding mask. During the coding ion implantation process, the mask layer 108 is not the mask used for coding. The coding process is conducted using the hard mask layer, which is the mask layer 102 that comprises the embedded buffer layer 106a and the opening 104a. Since the pre-coding opening can be accurately aligned to the gate, the coding ions can be accurately implanted to the coding region underlying the gate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method to lower a demand in an alignment accuracy in an integrated circuit manufacturing process, the method comprising:

providing a substrate;

forming a first mask layer over the substrate, wherein the first mask layer comprises a plurality of first openings and at least a second opening;

filling the first openings and the second opening with a buffer layer;

forming a second mask layer over the substrate;

patterning the second mask layer to form at least a third opening, wherein the third opening exposes at least a portion of the buffer layer in the second opening;

performing isotropic etching to remove the buffer layer in the second opening; and removing the second mask layer to expose the first mask layer, wherein the first opening in the first mask layer is filled with the buffer layer while the second opening is not filled with the buffer layer.

2. The method of claim 1, wherein filling the first openings and the second opening with the buffer layer comprises:

forming a buffer material layer over the substrate to fill the first opening and the second opening and to cover the first mask layer; and removing the buffer material layer that covers the first mask layer.

3. The method of claim 2, wherein removing the buffer layer includes performing an etch back process.

4. The method of claim 2, wherein removing the buffer that covers the mask layer includes performing a chemical mechanical polishing process.

5. The method of claim 1, wherein the buffer layer is formed with a spin-on material or a metal.

6. The method of claim 1, wherein when the buffer layer is a spin-on material, the buffer layer in the second opening is removed using a solution that comprises a hydrofluoric acid.

7. The method of claim 1, wherein removing the buffer layer in the second opening is by wet etching.

8. The method of claim 1, wherein the first mask layer comprises silicon oxide.

9. The method of claim 1, wherein the second mask layer includes a photoresist layer.

10. The method of claim 1, wherein the first openings and the second opening form an array of openings.

11. A method to lower an expectation in an alignment accuracy in an integrated circuit fabrication process, the method comprising:

providing a substrate;

forming an embedded layer over the substrate, wherein the embedded layer is formed by embedding a first material layer and a second material layer, wherein the first material layer is in a non-continuous phase, and the first material layer and the second material that encompasses the first material layer forms a continuous phase, and the first material layer is divided into a plurality first regions of the first material layer and at least a second region of the first material layer;

forming a mask layer over the substrate;

patterning the mask layer to form at least a first opening, wherein the first opening exposes at least the first material layer in the second region;

isotropic etching the first material layer in the second region to expose a sidewall of the second material layer that encompasses the first material layer in the second region to form a second opening; and removing the mask layer to expose the embedded layer that already comprises the second opening.

12. The method of claim 11, wherein the non-continuous phase first material layer forms an array, and the first material in the second region is an element of the array.

13. The method of claim 11, wherein forming the embedded layer includes forming a first material layer over the substrate, followed by encompassing the first material layer with the second material layer.

14. The method of claim 11, wherein forming the embedded layer includes forming a second material layer over the substrate, following by embedding the first material layer in the second material layer.

15. The method of claim 11, wherein the first material layer is formed with a spin-on material or a metal, and the second material is formed with a material that comprises silicon oxide.

16. The method of claim 15, wherein the spin-on material includes spin-on glass, and the metal includes tungsten, titanium or titanium nitride.

17. The method of claim 16, wherein when the first material layer is spin-on glass, the first material layer in the second region is removed by a solution that comprises an hydrofluoric acid.

18. The method of claim 11, wherein removing the first material layer in the second region includes wet etching.

19. The method of claim 11, wherein the mask layer includes a photoresist layer.

* * * * *